United States Patent
Obikane et al.

(10) Patent No.: US 8,726,748 B2
(45) Date of Patent: May 20, 2014

(54) PROBE APPARATUS AND SUBSTRATE TRANSFER METHOD

(75) Inventors: Tadashi Obikane, Yamanashi (JP); Kazuya Yano, Yamanashi (JP); Hiroshi Yamada, Yamanashi (JP); Masaru Suzuki, Yamanashi (JP); Yasuhito Yamamoto, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 615 days.

(21) Appl. No.: 12/939,323

(22) Filed: Nov. 4, 2010

(65) Prior Publication Data

US 2011/0107858 A1    May 12, 2011

(30) Foreign Application Priority Data

| Nov. 6, 2009 | (JP) | 2009-255158 |
| Nov. 6, 2009 | (JP) | 2009-255159 |
| Nov. 17, 2009 | (JP) | 2009-262082 |

(51) Int. Cl.
  *G01D 21/00*  (2006.01)
(52) U.S. Cl.
  USPC ........................................................ 73/866.5
(58) Field of Classification Search
  USPC ........................................................ 73/866.5
  See application file for complete search history.

(56) References Cited

U.S. PATENT DOCUMENTS

| 6,111,421 A | * | 8/2000 | Takahashi et al. | 324/750.04 |
| 2009/0267626 A1 | * | 10/2009 | Hosaka et al. | 324/754 |
| 2010/0040441 A1 | * | 2/2010 | Obikane | 414/222.01 |

FOREIGN PATENT DOCUMENTS

| CN | 101071784 A | 11/2007 |
| JP | 03-289152 A | 12/1991 |
| JP | 05-343497 A | 12/1993 |
| JP | 2005-093690 A | 4/2005 |
| JP | 2007-088286 A | 4/2007 |
| JP | 2007-329458 A | 12/2007 |
| JP | 2008-053550 A | 3/2008 |
| JP | 2009-099936 A | 5/2009 |
| JP | 2009-200271 A | 9/2009 |

OTHER PUBLICATIONS

Japanese Office action for 2009-262082 dated Aug. 9, 2011.
Japanese Office action for 2009-255158 dated Oct. 4, 2011.

* cited by examiner

*Primary Examiner* — Peter Macchiarolo
*Assistant Examiner* — Tamiko Bellamy
(74) *Attorney, Agent, or Firm* — Pearne & Gordon LLP

(57) ABSTRACT

A probe apparatus includes a plurality of prober chamber arranged in a straight line; and a loader chamber having a substrate transfer mechanism that takes out a test target substrate from a container provided in an upper area of the prober chamber, lowers the test target substrate to a height corresponding to a loading/unloading port of the prober chamber, moves in front of a row of the prober chambers in parallel to the row of the prober chambers and transfers the test target substrate into the prober chamber. A reading mechanism for reading information recorded on the test target substrate held on the substrate transfer mechanism is installed at a horizontal moving mechanism that moves the substrate transfer mechanism in front of the row of the prober chambers in parallel to the row of the prober chambers.

9 Claims, 10 Drawing Sheets

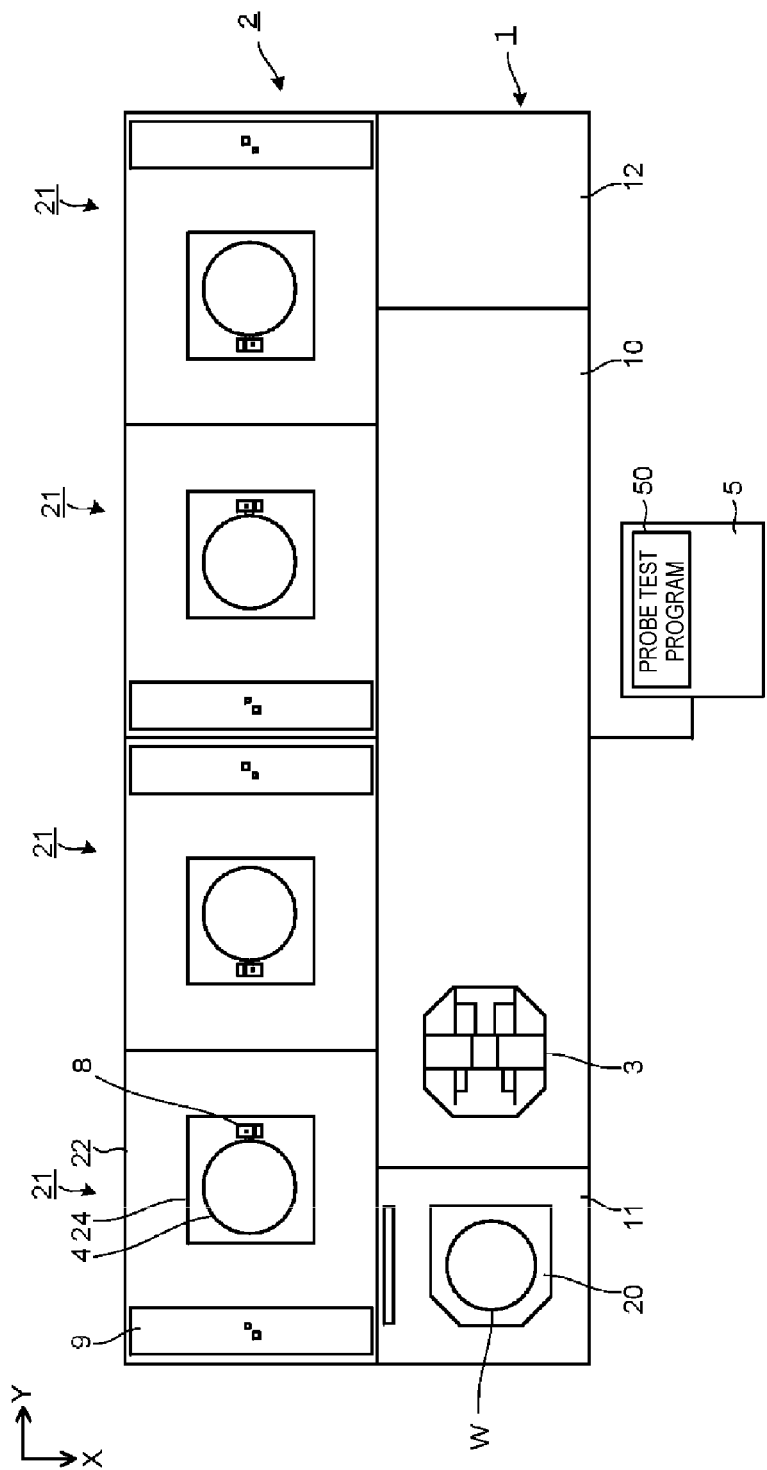

PROBE APPARATUS AND SUBSTRATE TRANSFER METHOD

CROSS-REFERENCE TO RELATED APPLICATION

This application claims the benefit of Japanese Patent Application No. 2009-262082 filed on Nov. 17, 2009, Japanese Patent Application No. 2009-255159 filed on Nov. 6, 2009 and Japanese Patent Application No. 2009-255158 filed on Nov. 6, 2009, the entire disclosures of which are incorporated herein by reference.

FIELD OF THE INVENTION

The present disclosure relates to a probe apparatus and a substrate transfer method in the probe apparatus.

BACKGROUND OF THE INVENTION

Conventionally, a probe apparatus has been used to perform a probe test for inspecting electric characteristics of a semiconductor chip by bringing probes (probe needles) of a probe card into contact with electrode pads of the semiconductor chip. Such a probe apparatus includes a prober chamber having a probe card and a mounting table; and a loader chamber equipped with a substrate transfer mechanism configured to transfer a wafer between a loading port accommodating a wafer carrier (FOUP) therein and the prober chamber.

The substrate transfer mechanism takes out a wafer from the wafer carrier loaded into the loading port. Then, after pre-alignment of the wafer is performed by a pre-alignment mechanism installed within the loader chamber or a pre-alignment mechanism installed at the substrate transfer mechanism, the substrate transfer mechanism transfers the wafer onto the mounting table within the prober chamber. Further, there is also known a probe apparatus having a loader chamber equipped with a reading mechanism (e.g., an optical character reading (OCR) mechanism) for reading information such as a bar code or characters recorded on a wafer held on a substrate transfer mechanism (see, for example, Patent Document 1).

Further, there is also known a probe apparatus in which a plurality of prober chambers are provided for a single loader chamber. In such a probe apparatus, to reduce a footprint and a transfer height by a transfer robot within a clean room, a FOUP (wafer carrier) 20 is placed at a position higher than that of each prober chamber 21, as illustrated in FIG. 9. In such a configuration, a wafer taken out of the FOUP 20 is lowered to a height corresponding to a loading/unloading port 23 of the prober chamber 21 by a substrate transfer mechanism 3 installed within the loader chamber 1. Then, the wafer is transferred in horizontal direction by the substrate transfer mechanism 3 to be loaded into or unloaded from the prober chamber 21 through the loading/unloading port 23. In such a probe apparatus, an OCR mechanism 60 is installed below a mounting unit for the FOUP 20.

In the probe apparatus having the mentioned configuration, to transfer the wafer taken out of the FOUP 20 into the prober chamber 21, the substrate transfer mechanism 3 is first lowered to a height corresponding to the OCR mechanism 60 (as indicated by an arrow A of FIG. 9), and the substrate transfer mechanism 3 is then moved in horizontal direction toward the OCR mechanism 60 (as indicated by an arrow B of FIG. 9). Then, after characters recorded on the wafer is read by the OCR mechanism 60, the substrate transfer mechanism 3 is returned back to its previous horizontal position (as indicated by an arrow C of FIG. 9) and then is lowered again to a height corresponding to the loading/unloading port 23 of the prober chamber 21 (as indicated by an arrow D of FIG. 9). Thereafter, the substrate transfer mechanism 3 transfers the wafer horizontally to the front of the loading/unloading port 23 of the prober chamber 21 (as indicated by an arrow E of FIG. 9).

Meanwhile, there has been used a substrate transfer mechanism having, e.g., two arms for holding two substrates as substrate holding members. While a probe test for a wafer is being performed in a prober chamber, a next wafer to be tested is taken out by one of the arms, and pre-alignment of the next wafer is performed. Then, upon the completion of the test for the wafer in the prober chamber, the tested wafer is received by the other one of the arms, and the next wafer to be tested held on the one arm is transferred onto the mounting table within the prober chamber.

The wafer held on the arm of the substrate transfer mechanism is transferred onto the mounting table within the prober chamber through the loading/unloading port provided in a front side of the prober chamber. Here, the substrate transfer mechanism needs to be stopped at a position in front of each prober chamber.

Meanwhile, there is also known a probe apparatus having a single substrate transfer mechanism and a plurality of prober chambers (see, for example, Patent Document 2). In such a probe apparatus, the substrate transfer mechanism is configured to be moved in left and right directions on a rail provided in front of the plurality of prober chambers that are arranged in a straight line. As depicted in FIG. 10, to transfer a wafer into each prober chamber, a substrate transfer mechanism 3 needs to be moved to a position in front of the loading/unloading port of each prober chamber. In FIG. 10, reference numerals 35 and 36 are first and second arms for holding wafers thereon in the substrate transfer mechanism 3.

Patent Document 1: Japanese Patent Laid-open Publication No. 2007-329458

Patent Document 2: Japanese Patent Laid-open Publication No. H3-289152

In the aforementioned probe apparatuses, throughput needs to be further improved so as to perform test of target substrates efficiently. Further, in the above-described probe apparatuses, their footprint within the clean room needs to be further reduced. Moreover, the atmosphere within the prober chamber needs to be maintained clean so as to perform the test of the target substrates in a clean atmosphere.

BRIEF SUMMARY OF THE INVENTION

In view of the foregoing, the present disclosure provides a probe apparatus capable of testing a target substrate efficiently by improving throughput. Further, the present disclosure also provides a probe apparatus capable of reducing a footprint thereof. Moreover, the present disclosure also provides a probe apparatus capable of maintaining a clean atmosphere within a prober chamber. In addition, the present disclosure further provides a substrate transfer method capable of improving throughput of a substrate transfer process and, also, capable of reducing a size of a loader chamber in a probe apparatus having a plurality of prober chambers and a transfer mechanism configured to be moved in left and right direction in front of the prober chambers.

In accordance with one aspect of the present disclosure, there is provided a probe apparatus including a plurality of prober chamber arranged in a straight line; and a loader chamber having a substrate transfer mechanism that takes out a test target substrate from a container provided in an upper area of the prober chamber, lowers the test target substrate to a height corresponding to a loading/unloading port of the prober chamber, moves in front of a row of the prober chambers in parallel to the row of the prober chambers and transfers the test target substrate into the prober chamber. Electrical characteristics of a test target chip on the test target substrate are measured by bringing electrode pads on the test target substrate mounted on a mounting table installed within the prober chamber into contact with probes of a probe card. A reading mechanism for reading information recorded on the test target substrate held on the substrate transfer mechanism is installed at a horizontal moving mechanism that moves the substrate transfer mechanism in front of the row of the prober chambers in parallel to the row of the prober chambers.

In accordance with another aspect of the present disclosure, there is provided a probe apparatus including a prober chamber having therein a mounting table; and a loader chamber having a substrate transfer mechanism that transfers a test target substrate taken out of a container onto the mounting table within the prober chamber. Electrical characteristics of a test target chip on the test target substrate are measured by bringing electrode pads on the test target substrate mounted on the mounting table into contact with probes of a probe card. An angular or rounded loading/unloading port is formed in a sidewall of a housing of the prober chamber so as to be extended from a front side to a lateral side of the sidewall.

In accordance with still another aspect of the present disclosure, there is provided a substrate transfer method in a probe apparatus including even-number prober chambers arranged in a straight line and a loader chamber having a transfer mechanism for transferring a test target substrate taken out of a container into the prober chamber after moving in front of a row of the prober chambers in parallel to the row of the prober chambers. The probe apparatus measures electrical characteristics of a test target chip on the test target substrate by bringing electrode pads on the test target substrate mounted on a mounting table installed within the prober chamber into contact with probes of a probe card. The substrate transfer method includes moving the transfer mechanism to a substantially front center position of two adjacent prober chambers, stopping the transfer mechanism at the substantially front center position, and loading or unloading the test target substrate into or from the two prober chambers by the transfer mechanism.

In accordance with the probe apparatus of the present disclosure, throughput can be improved, and, thus, the test of the target substrate can be carried out efficiently. Further, since the wafer can be loaded into and unloaded from a deviated position from a front center of the prober chamber, the entire apparatus can be configured to have a small footprint. Moreover, by installing a shutter member for opening and closing an angular or rounded opening, the inside of each prober chamber can be hermetically sealed from the exterior air, so that entrance of particles into the prober chamber can be prevented and thermal insulating effect in the prober chamber can be acquired.

Further, in accordance with the substrate transfer method of the present disclosure, the substrate transfer mechanism is stopped in front of a substantially center position between the two adjacent prober chambers, and the substrate transfer mechanism loads and loads wafers with respect to the two prober chambers. Thus, a moving distance of the substrate transfer mechanism can be shortened, and, thus, throughput of the substrate transfer process can be improved. Furthermore, by shortening a moving range of the substrate transfer mechanism in left and right directions, the size of the loader chamber can be further reduced.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 2 is a plane view illustrating a schematic configuration of the probe apparatus in accordance with the first embodiment;

DETAILED DESCRIPTION OF THE INVENTION

Hereinafter, a probe apparatus and a substrate transfer method in the probe apparatus will be described in accordance with illustrative embodiments of the present disclosure with reference to FIGS. 1 to 8.

Figure 1:
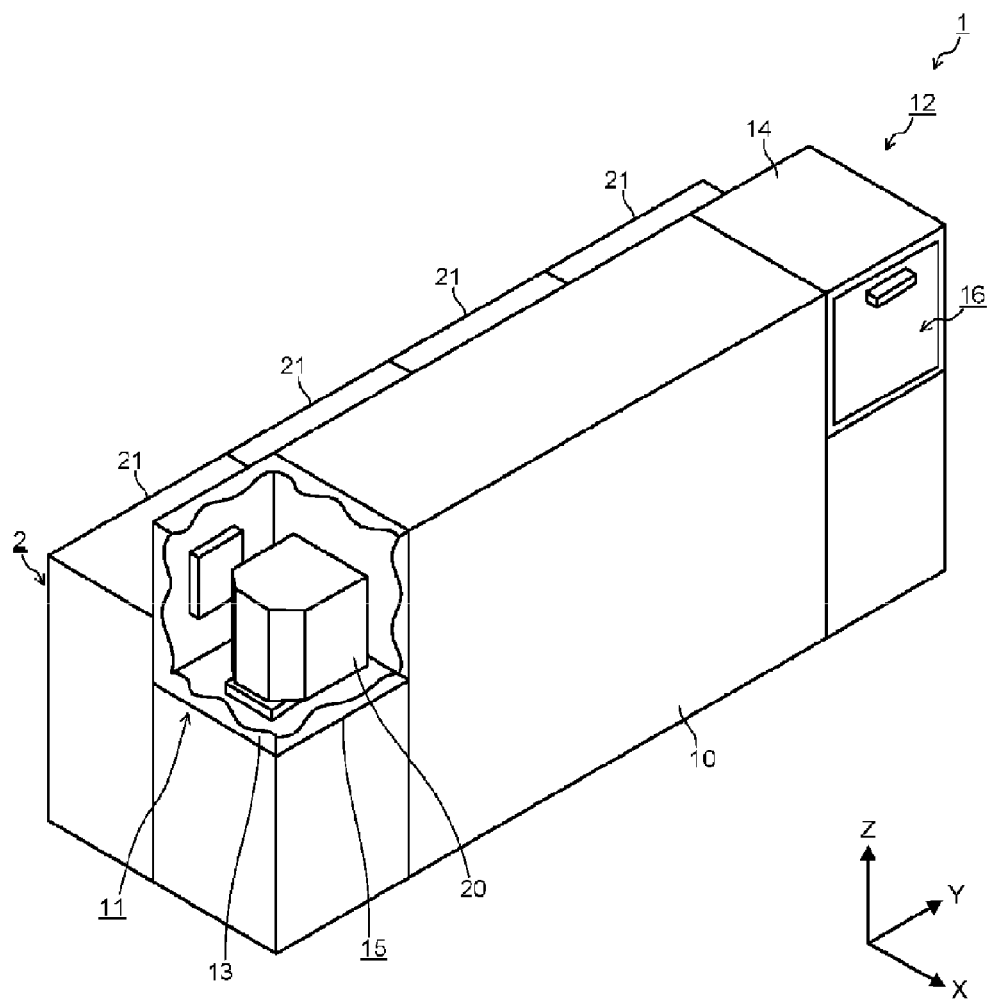
FIG. 1 is a perspective view illustrating a schematic configuration of a probe apparatus in accordance with a first embodiment of the present disclosure.

As shown in FIG. 1, the probe apparatus may include a loader chamber 1 configured to transfer a wafer W as a substrate having thereon a multiple number of test target chips; and a main body 2 configured to probe the wafer W. First, an overall layout of the loader chamber 1 and the main body 2 will be explained.

The loader chamber 1 may include a first loading port 11 and a second loading port 12 arranged apart from each other in Y direction (left-right direction of FIG. 1) while facing each other; and a transfer chamber 10 provided between the first and second loading ports 11 and 12. A FOUP 20 as a sealed container accommodating a plurality of wafers W therein is loaded into the first or the second loading port 11 or 12.

The loading port 11 (12) may include a casing 13 (14), and the FOUP 20 is loaded into the casing 13 (14) through a loading opening 15 (16) formed in X direction of FIG. 1. A lid of the loaded FOUP 20 is opened by a non-illustrated opening/closing mechanism provided at the loading port 11 (12) and is held on an inner sidewall of the loading port 11 (12). After the lid is opened, the FOUP 20 is rotated such that its opening faces the transfer chamber 10.

Referring to FIG. 2, a control unit 5 for controlling the probe apparatus is connected to the loader chamber 1. The control unit 5 may be composed of, e.g., a computer, and it may include a data processing unit having a memory and a CPU. A control program such as a probe test program 50 may be inputted to the control unit 5. The probe test program 50 may include steps for controlling a series of operations of each component and a wafer transfer schedule for loading the FOUP 20 into the loading port 11 or 12, loading the wafer W into the main body 2 from the FOUP 20 to perform a probe test of the wafer W, returning the wafer W back into the FOUP 20 and unloading the FOUP 20. Further, the probe test program 50 may include a program related to input or display of processing parameters. The probe test program 50 may be stored in a storage medium such as a flexible disk, a compact disk, a MO (magneto-optical) disk, or a hard disk and installed in the control unit 5.

The main body 2 is arranged adjacent to the loader chamber 1 in the X direction. The main body 2 includes a plurality of (e.g., four) prober chambers 21 arranged in the Y direction. Further, a non-illustrated test head may be provided in an upper part area of each prober chamber 21.

Figure 3A:
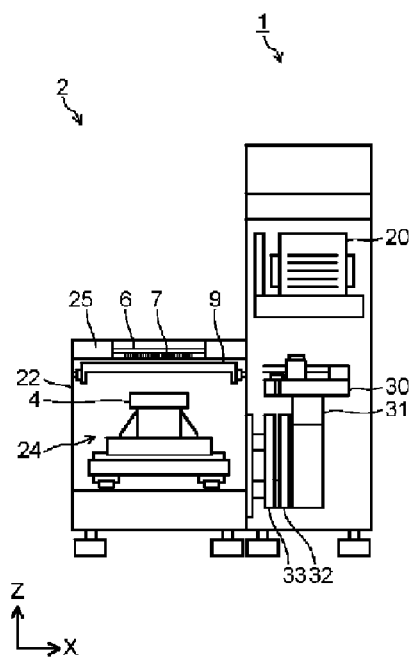
FIGS. 3A and 3B are side views illustrating a schematic configuration of the probe apparatus in accordance with the first embodiment.
Figure 3B:
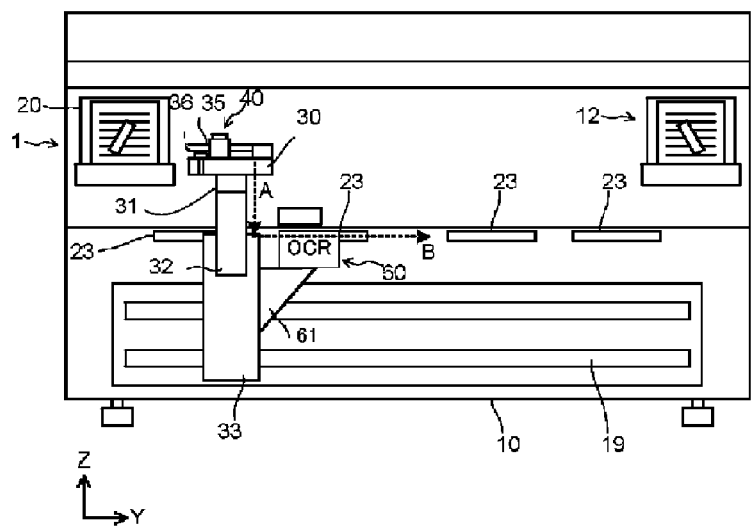

As illustrated in FIGS. 3A and 3B, each prober chamber 21 may include a housing 22, and a stage unit 24 and an upper imaging unit 9 are provided within the housing 22. The stage unit 24 is movable in X-axis and Y-axis directions and is also movable in a Z-axis (up and down) direction. That is, the stage unit 24 is movable lengthwise and crosswise on a horizontal plane and is also movable in a height direction. Further, an upper part of the stage unit 24 is rotatable about a vertical axis. A wafer chuck 4 having a vacuum-attracting function as a mounting table for mounting thereon a wafer W is installed on the top of the stage unit 24. Further, a lower imaging unit 8 (see FIG. 2) having, e.g., a micro camera for capturing an image of a probe card 6 is installed at a side area of the stage unit 24.

As depicted in FIGS. 3A and 3B, the upper imaging unit 9 may include, e.g., a micro camera for capturing an image of the wafer W mounted on the wafer chuck 4. A head plate 25 as a ceiling of the housing 22 is installed above a movement area of the wafer chuck 4 and the upper imaging unit 9, and the probe card 6 is fixed to and held by the head plate 25.

A non-illustrated test head is fixed to a top surface of the probe card 6, and the probe card 6 and the test head are electrically connected via a non-illustrated pogo pin unit. Further, probe needles 7 electrically connected with electrodes on a top surface of the probe card 6 respectively are provided on the bottom surface of the probe card 6 to correspond to the arrangement of electrode pads of the wafer W. For example, the probe needles 7 are provided on the entire surface of the probe card 6.

As shown in FIGS. 3A and 3B, a substrate transfer mechanism 3 for transferring a wafer W is installed in the transfer chamber 10. The substrate transfer mechanism 3 may include a first arm 35 and a second arm 36 installed on a transfer base 30 so as to be movable forward and backward. The transfer base 30 is configured to be rotatable about a vertical axis, to be movable up and down and, also, to be movable in a Y direction of FIG. 3B. Further, as shown in FIGS. 3A and 3B, a base moving member 33 is moved along a rail 19 extended in the Y direction, and a base elevating member 32 is moved up and down with respect to the base moving member 33. Further, a rotating member 31 is installed at the base elevating member 32.

Moreover, an optical character reading (OCR) mechanism 60 for reading information recorded on a wafer W is installed at the base moving member 33 that is moved in the Y direction along the rail 19. The OCR mechanism 60 is supported on the base moving member 33 by a supporting member 61 and is located at a height substantially same as that of a loading/unloading port 23 of the prober chamber 21. In this configuration, when a wafer W is lowered to a height corresponding to the loading/unloading port 23 of the prober chamber 21 and is transferred in the Y direction, the wafer W need not be temporarily stopped on the way down in the height direction, and characters on the wafer W can be read by the OCR mechanism 60 after the wafer W is lowered to the height corresponding to the loading/unloading port 23. That is, in the present embodiment, the transfer operation for the wafer W is a two-step operation including a lowering operation A for lowering the wafer W taken out of the FOUP 20 to the height corresponding to the loading/unloading port 23 of the prober chamber 21 and a horizontal transfer operation B for horizontally transferring the lowered wafer W to the front of the loading/unloading port 23. Thus, reading of the characters on the wafer W by the OCR mechanism 60 can be carried out through rotation of the transfer base 30 and extension/contraction of the first and second arms 35 and 36 after the wafer W is located at the lowered position.

Figure 9:
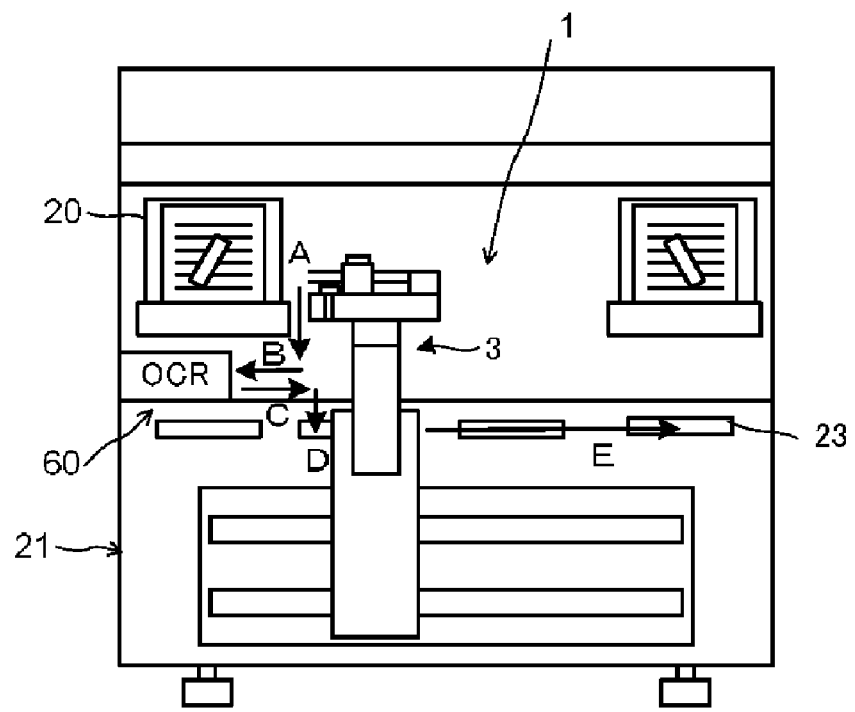
FIG. 9 is a side view illustrating a schematic configuration of a conventional probe apparatus.
Figure 10:
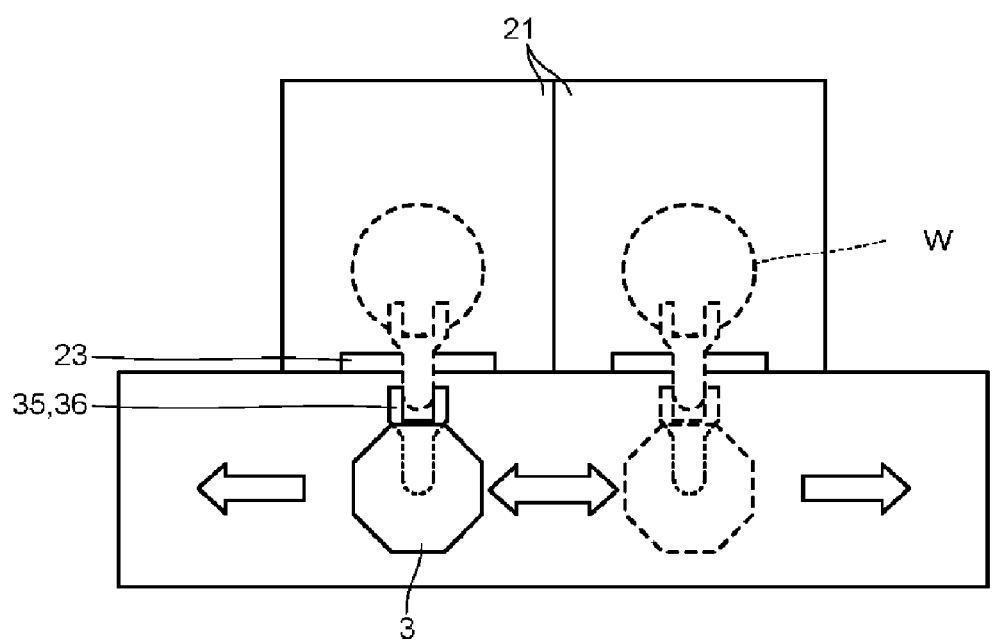
FIG. 10 is a diagram for describing a conventional substrate transfer method.

As stated above, in the present embodiment, since the OCR mechanism 60 is installed on the base moving member 33 movable in the Y direction along the rail 19, time required to transfer the wafer W onto the wafer chuck 4 in the prober chamber 21 after taking out the wafer W from the FOUP 20 by the substrate transfer mechanism 3 can be shortened as compared to a conventional probe apparatus shown in FIG. 9. That is, as compared to a case of reading the characters by an OCR mechanism 60 after a wafer W taken out of a FOUP 20 is temporarily stopped on the way down and moved in a horizontal direction (when performing a wafer transfer as indicated by arrows A→B→C→D→E) as illustrated in FIG. 9, the transfer operation by the substrate transfer mechanism 3 can be simplified to A→B as depicted in FIG. 3B. Due to simplification of transfer path and reduction of the frequency of temporary stop of the wafer transfer, transfer efficiency can be improved, and, thus, throughput can also be enhanced.

Figure 4:
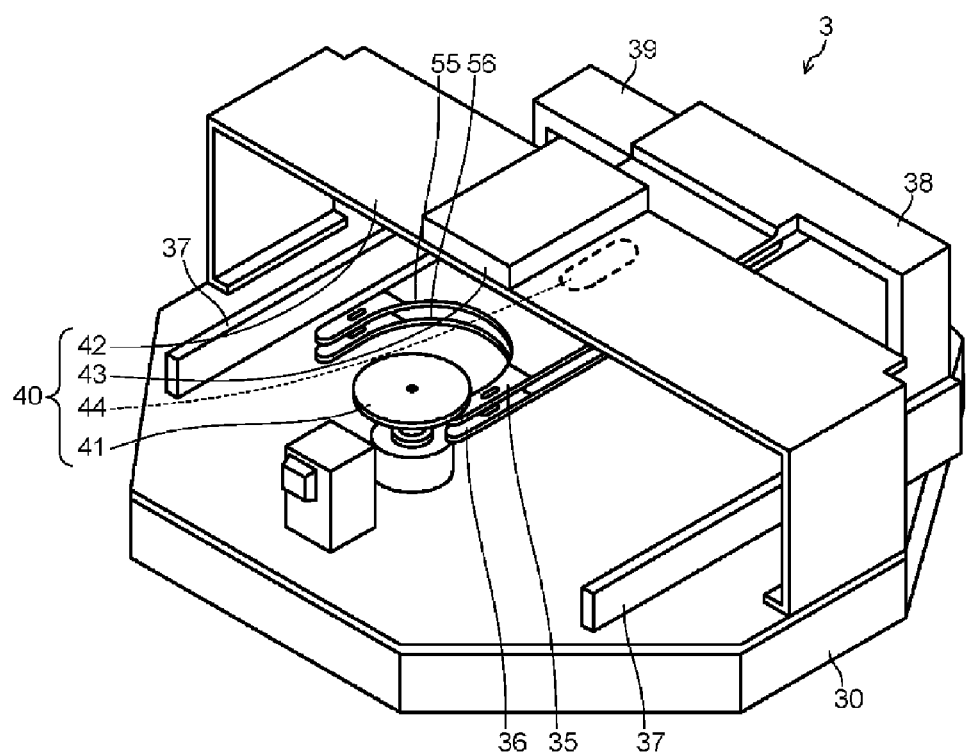
FIG. 4 is a perspective view illustrating a schematic configuration of a wafer transfer arm of the probe apparatus in accordance with the first embodiment.

Furthermore, as depicted in FIG. 4, the first arm 35 and the second arm 36 are provided with U-shaped cutoff portions 55 and 56, respectively. A pair of guide rails 37 is installed in parallel to each other at left and right end sides of the arms on the top surface of the transfer base 30. The first and second arms 35 and 36 are moved back and forth along the guide rails 37 via arm guides 38 and 39, respectively.

In addition, a pre-alignment mechanism 40 for pre-aligning a wafer W mounted on the first arm 35 or the second arm 36 may be installed at the transfer base 30. As illustrated in FIG. 4, the pre-alignment mechanism 40 may include a chuck 41, a sensor bridge 42, a light receiving sensor 43, and a light transmitting part 44. Further, a non-illustrated light emitting member is provided under the first and second arms 35 and 36.

The chuck 41 is a rotary stage configured to rotate the wafer W. A rotation center of the chuck 41 lies on a position corresponding to a center of the wafer W on the first arm 35 or the second arm 36 moved backward on the transfer base 30. The chuck 41 has an elevating member moved up and down in a Z-axis direction of FIG. 4. In a standby state in which pre-alignment is not performed, the chuck 41 is moved downward and stopped at a position where it does not interfere with forward and backward movements of the first and second arms 35 and 36. When pre-alignment is performed, on the other hand, the chuck 41 is moved upward to slightly lift the wafer W from the first arm 35 or the second arm 36, thus allowing the wafer W to be rotated.

The sensor bridge 42 is installed on the top surface of the transfer base 30 so as not to interfere with the wafer W held on the first arm 35 or the second arm 36. The light receiving sensor 43 for receiving light having penetrated the wafer W after irradiated from the non-illustrated light emitting member is fixed on the sensor bridge 42. Further, the light transmitting part 44 extending in an X-axis direction of FIG. 4 is formed in the first and second arms 35 and 36, and, thus, the light from the light emitting member is transmitted through the light transmitting part 44 and irradiated to a region including a periphery (edge) of the wafer W lifted from the first arm 35 or the second arm 36 by the chuck 41.

Figure 5:
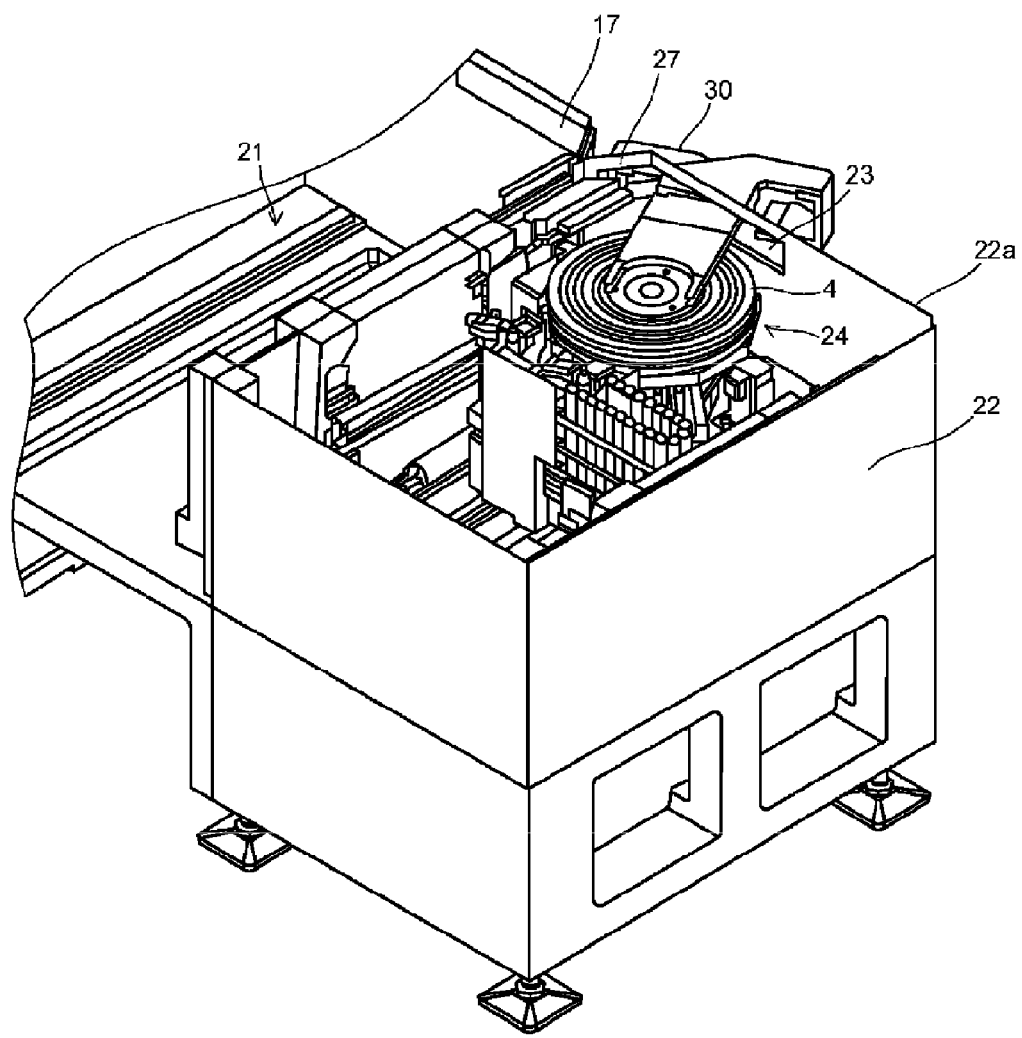
FIG. 5 is a perspective view illustrating a schematic configuration of the inside of a prober chamber of the probe apparatus in accordance with the first embodiment.

Now, configuration of a wafer loading/unloading port in accordance with the first embodiment will be explained. As depicted in FIG. 5, the wafer chuck 4 is installed on an XY stage so as to be movable between a transfer position for transferring the wafer W, an image capturing position for capturing an image of the surface of the wafer W and a test position for bringing the wafer W into contact with the probe needles 7 of the probe card 6. Among sidewalls forming the housing 22 accommodating the XY stage and the wafer chuck 4, a chamfered corner portion 27 is formed at a sidewall 22a on the side of the transfer chamber 10 (i.e., on the front side of the housing 22), specifically, at the sidewall 22a's region in contact with an adjacent prober chamber 21. That is, the corner portion 27 is formed by chamfering a corner between the front sidewall 22a and a sidewall adjacent to the prober chamber 21. The loading/unloading port 23 is opened and extended from the front sidewall 22a of the housing 22 to the corner portion 27 such that the loading/unloading port 23 has an angular shape. The inside of the transfer chamber 10 and the inside of the housing 22 communicate with each other through the loading/unloading port 23.

Figure 6:
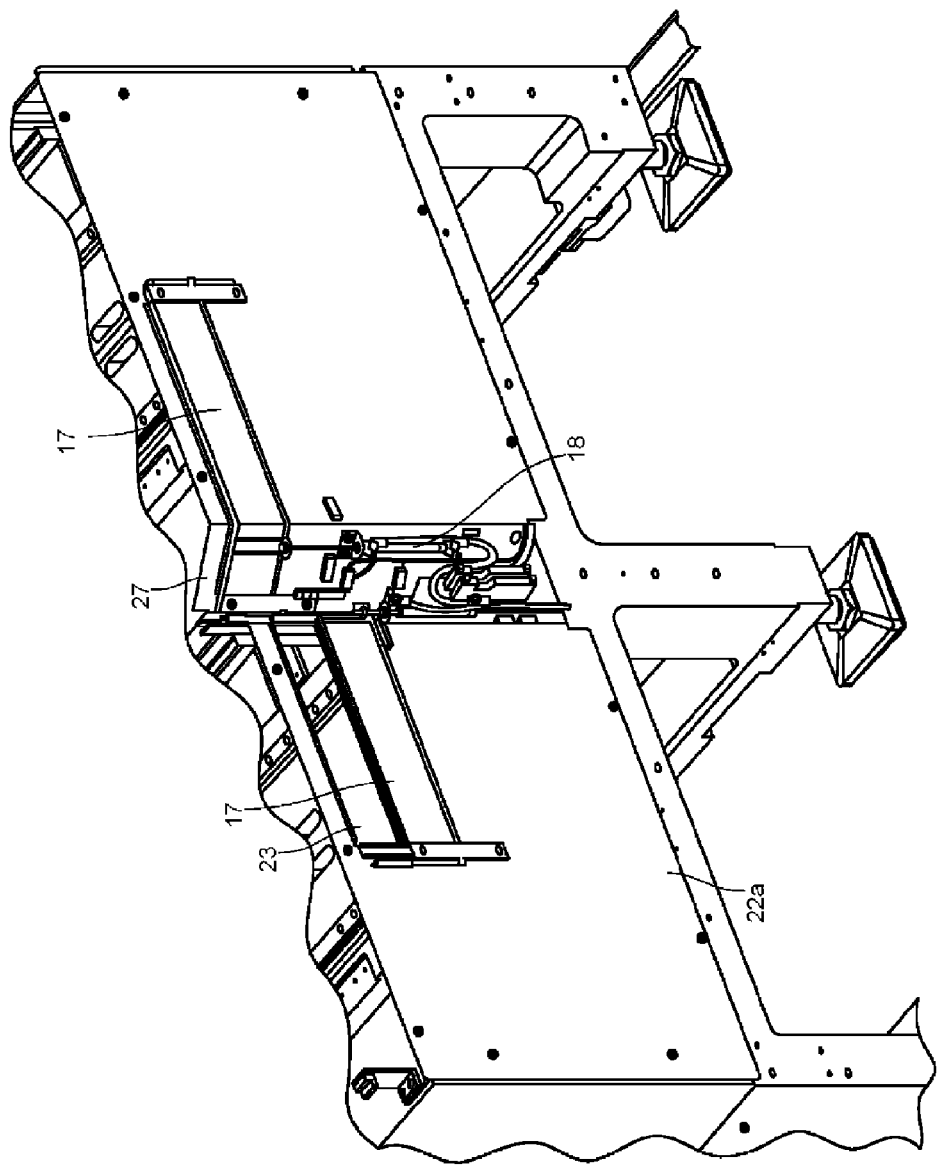
FIG. 6 is a perspective view illustrating the exterior of a loading/unloading port of the probe apparatus in accordance with the first embodiment.

As depicted in FIG. 6, a shutter member 17 having an angular shape conforming to the shape of the loading/unloading port 23 is installed at the loading/unloading port 23. The shutter member 17 is moved up and down by a cylinder 18, so that the loading/unloading port 23 is opened and closed. Except when the wafer W is loaded or unloaded, the loading/unloading port 23 is closed by the shutter member 17, thus allowing the inside of the prober chamber 21 to be maintained hermetically sealed. When the wafer W is transferred onto the wafer chuck 4 within the housing 22, the cylinder 18 is operated to lower the shutter member 17, so that the loading/unloading port 23 is opened.

Now, a series of process sequences for a probe test performed by the probe apparatus described above will be discussed. First, a wafer W is unloaded from the FOUP 20 mounted on the loading port 11 or 12 by the substrate transfer mechanism 3, and pre-alignment of the wafer W is performed by the pre-alignment mechanism 40 combined with the substrate transfer mechanism 3 as described above.

Then, the wafer W is lowered to a height corresponding to a loading/unloading port 23 of a preset prober chamber 21, and characters recorded on the wafer W is read by the OCR mechanism 60. Thereafter, the wafer W is transferred horizontally to the loading/unloading port 23 of the preset prober chamber 21. Afterward, the shutter member 17 is lowered to open the loading/unloading port 23, and the wafer W is transferred onto the wafer chuck 4 within the prober chamber 21 through the loading/unloading port 23. In such a wafer loading operation for loading the wafer W from the FOUP 20 onto the wafer chuck 4 within the prober chamber 21, since the OCR mechanism 60 is installed on the base moving member 33 movable in the Y direction along the rail 19 in the present embodiment, as described above, time required to transfer the wafer W can be shortened as compared to the conventional probe apparatus depicted in FIG. 9.

Here, by closing the shutter member 17 after the loading of the wafer W is completed, the inside of the prober chamber 21 can be hermetically sealed. Accordingly, deterioration of heat or the dew point during the wafer transfer can be alleviated.

Figure 7A:
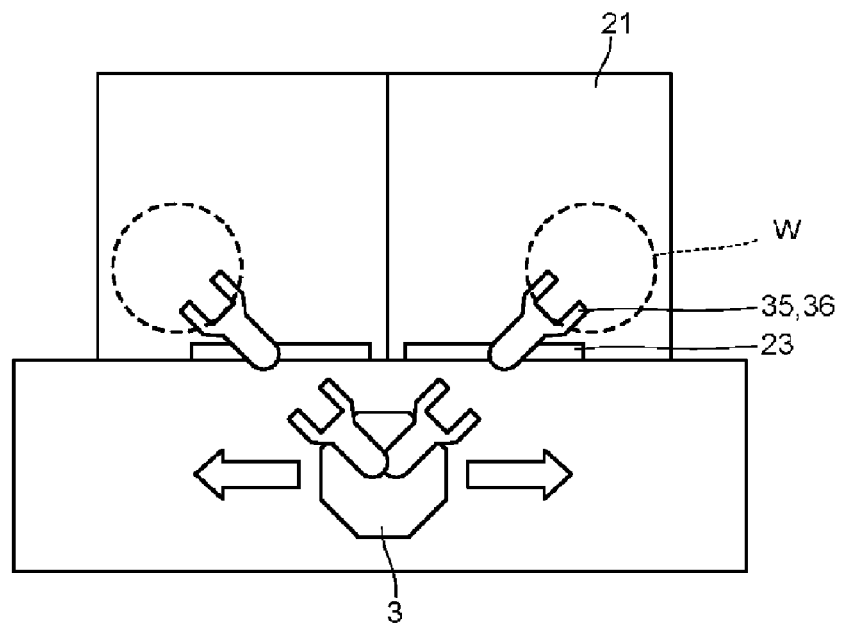
FIGS. 7A and 7B are diagrams for describing a substrate transfer method in the probe apparatus in accordance with the first embodiment.

As shown in FIG. 7A, by forming loading/unloading ports 23 for the wafer W so as to be closely located between two adjacent prober chambers 21, an approximately center position between the two stages of the two adjacent prober chambers 21 can be set as a single wafer loading position of the substrate transfer mechanism 3 for the two prober chambers 21.

Figure 7B:
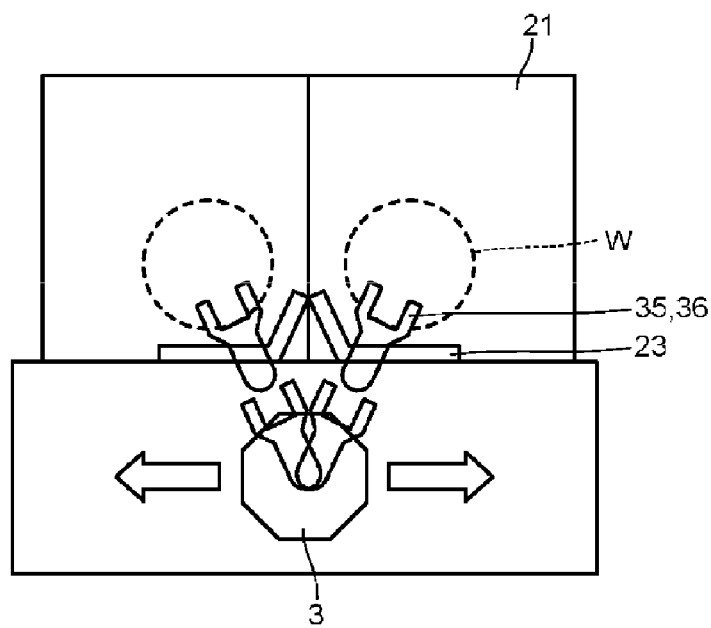

Furthermore, as depicted in FIG. 7B, corner portions 27 of the two adjacent prober chambers 21 adjoined to each other via a housing sidewall (shielding plate) are chamfered, so that a wafer W can be more easily loaded into and unloaded from the prober chambers 21 by the substrate transfer mechanism 3 positioned at one place. That is, in FIG. 7A, when wafers W are transferred onto the wafer chucks 4 of the two prober chambers 21 from the central loading position, the loading/unloading ports on the front side need to have sufficient widths, and a sufficient arm stroke is also required. However, by forming the loading/unloading ports 23 to have the shapes as depicted in FIG. 7B, the wafers W can be transferred into the two prober chambers 21 with a minimum arm stroke while avoiding interference between the transfer arm and the loading/unloading ports 23.

As stated above, by transferring the wafers W onto the two wafer chucks 4 from one place, a moving distance of the substrate transfer mechanism 3 can be reduced. Therefore, throughput can be improved, and the size of the substrate transfer mechanism 3 can be reduced.

By repeating the above-described operations, the wafers W are transferred into all prober chambers 21, and probe tests of the wafers W are performed in the respective prober chambers 21. In the meantime, the substrate transfer mechanism 3 unloads a next wafer W to be tested by using the first arm 35 and waits in a standby mode in the transfer chamber 10 after performing pre-alignment of the next wafer W.

In a first prober chamber 21 into which a wafer W is loaded, image data of end positions of the probe needles 7 and image data of positions of the non-illustrated electrode pads on the surface of the wafer W are obtained by capturing an image of the probe card 6 and an image of the wafer W on the wafer chuck 4 by the lower imaging unit 8 and the upper imaging unit 9, respectively. Based on the obtained image data, contact coordinates for the contact between the probe needles 7 and the electrode pads are calculated, and the wafer W is moved to the calculated contact coordinates.

Then, the probe needles 7 and the electrode pads are brought into contact with each other. After a probe test is completed, the wafer chuck 4 is moved to the vicinity of the loading/unloading port 23. At this time, since no wafer W is mounted on the second arm 36 of the substrate transfer mechanism 3, the tested wafer W is received by the second arm 36, and the untested wafer W held on the first arm 35 is transferred onto the wafer chuck 4. Thereafter, the substrate transfer mechanism 3 returns the tested wafer W back into the FOUP 20, and if any untested wafer W remains in the FOUP 20, a next wafer W to be tested is unloaded from the FOUP 20 by the substrate transfer mechanism 3.

The above-described series of processes are also performed in a second to a fourth prober chamber 21. In the probe apparatus in accordance with the first embodiment, through the above-described processes, wafers W are sequentially transferred into the four prober chambers 21 by the single substrate transfer mechanism 3 and probe tests are performed therein. The probe tests as discussed above are performed under the control of the control unit 5 that controls each unit based on the probe test program 50. In the present embodiment, although the four prober chambers 21 are installed, the number of the prober chambers 21 is not limited to four as long as they are even-number.

Figure 8:
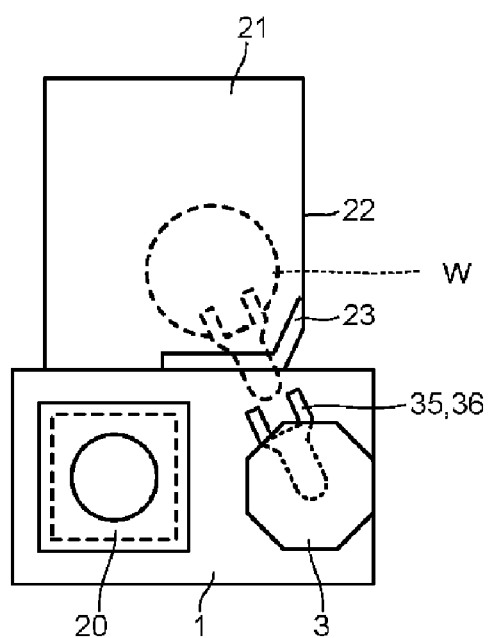
FIG. 8 is a plane view illustrating a schematic configuration of a probe apparatus in accordance with a second embodiment of the present disclosure.

Now, a second embodiment of the present disclosure will be described with reference to FIG. 8. A probe apparatus in accordance with the second embodiment may include a loader chamber 1 having an accommodating unit accommodating a FOUP 20 therein and a substrate transfer mechanism 3; and a single prober chamber 21. On a front corner portion 27 of a housing 22 of the prober chamber 21, an angular loading/unloading port 23 is formed, as in the first embodiment.

The substrate transfer mechanism 3 positioned at a deviated position from a front center of the prober chamber 21 does not move in horizontal direction and is configured to load or unload a wafer W taken out of the FOUP 20 into the prober chamber 21 through the loading/unloading port 23 through θ rotation movement and extension/contraction movement of a first arm 35 and a second arm 36. The other configurations of the probe apparatus in accordance with the second embodiment except those mentioned above are the same as those described in the first embodiment, and, thus, redundant description thereof will be omitted.

By forming such an angular loading/unloading port 23 in the prober chamber 21, freedom of arrangement of the prober chamber 21, the substrate transfer mechanism 3 and the accommodating unit of the FOUP 20 can be enhanced, so that a footprint of the entire apparatus can be reduced.

Furthermore, although there has been explained a case where the loading/unloading port 23 of the prober chamber 21 has an angular shape in the first and second embodiments, the loading/unloading port 23 may have a rounded shape. Moreover, although there has been explained a case where the cylinder 18 is used as the opening/closing driving mechanism for the shutter member 17, a motor or another driving mechanism may be used instead. In addition, the inside of the prober chamber 21 sealed by the shutter member 17 may be filled with dry air to prevent condensation within the prober chamber 21.

What is claimed is:

1. A probe apparatus comprising:
a plurality of prober chambers arranged in a straight line; and
a loader chamber having a substrate transfer mechanism that takes out a test target substrate from a container provided in an upper area of the prober chambers, lowers the test target substrate to a substantially the same height as a loading/unloading port of each prober chamber, moves in front of a row of the prober chambers in parallel to the row of the prober chambers and transfers the test target substrate into the prober chamber,
wherein electrical characteristics of a test target chip on the test target substrate are measured by bringing electrode pads on the test target substrate mounted on a mounting table installed within the prober chamber into contact with probes of a probe card,
a reading mechanism for reading information recorded on the test target substrate held on the substrate transfer mechanism is installed at a horizontal moving mechanism that moves the substrate transfer mechanism in front of the row of the prober chambers in parallel to the row of the prober chambers at substantially the same height as the loading/unloading port of the prober chamber, and
the information recorded on the test target substrate is read by the reading mechanism at a position where the test target substrate is lowered to substantially the same height as the loading/unloading port of the prober chamber.

2. The probe apparatus of claim 1, wherein the horizontal moving mechanism includes:
a rail installed in front of the row of the prober chambers in parallel to the row of the prober chambers; and
a base moving member that is movable along the rail and connected to the substrate transfer mechanism, and
the reading mechanism is fixed to the base moving member.

3. The probe apparatus of claim 1, wherein the information recorded on the test target substrate is read by the reading mechanism when the substrate transfer mechanism is located at a height which is same as a height of the substrate transfer mechanism when the substrate transfer mechanism loads or unloads the test target substrate through the loading/unloading port of the prober chamber.

4. The probe apparatus of claim 1, wherein the information recorded on the test target substrate is read by the reading mechanism during a process of loading the test target substrate through the loading/unloading port of the prober chamber by the substrate transfer mechanism.

5. The probe apparatus of claim 1, wherein the reading mechanism is an optical character reading mechanism that reads characters recorded on the test target substrate.

6. A probe apparatus comprising:
a prober chamber having therein a mounting table; and
a loader chamber having a substrate transfer mechanism that transfers a test target substrate taken out of a container onto the mounting table within the prober chamber,
wherein electrical characteristics of a test target chip on the test target substrate are measured by bringing electrode pads on the test target substrate mounted on the mounting table into contact with probes of a probe card,
an angular or rounded loading/unloading port is formed in a sidewall of a housing of the prober chamber so as to be extended from a front side to a lateral side of the sidewall,
a reading mechanism for reading information recorded on the test target substrate held on the substrate transfer mechanism is installed at substantially the same height as the loading/unloading port, and
the information recorded on the test target substrate is read by the reading mechanism at a position where the test target substrate is lowered to substantially the same height as the loading/unloading port.

7. The probe apparatus of claim 6, wherein a shutter member for opening and closing the loading/unloading port is installed, and the shutter member has an angular or rounded shape conforming to the shape of the loading/unloading port.

8. The probe apparatus of claim 7, wherein the shutter member is opened and closed by a cylinder.

9. The probe apparatus of claim 6, wherein the housing is formed to have a chamfered corner portion at a connection point between the front side and the lateral side of the sidewall, and the loading/unloading port is opened and extended from the front side of the housing to the corner portion.

* * * * *